United States Patent [19]

Talbot et al.

[11] 4,220,929
[45] Sep. 2, 1980

[54] SIGNAL EXPANDER

[75] Inventors: Daniel B. Talbot, Hudson, Mass.; David E. Blackmer, Wilton, N.H.

[73] Assignee: DBX, Inc., Newton, Mass.

[21] Appl. No.: 973,019

[22] Filed: Dec. 26, 1978

[51] Int. Cl.² .............................................. H03G 7/00
[52] U.S. Cl. .................................... 330/136; 330/141; 330/279; 330/281
[58] Field of Search ............... 330/136, 141, 279, 281; 325/410

[56] References Cited

U.S. PATENT DOCUMENTS

| 3,475,688 | 10/1969 | Masonson | 330/136 X |
| 3,980,964 | 9/1976 | Grodinsky | 330/136 X |

FOREIGN PATENT DOCUMENTS 430351 10/1974 U.S.S.R. .................. 330/136

Primary Examiner—James B. Mullins
Attorney, Agent, or Firm—Schiller & Pandiscio

[57] ABSTRACT

An improved signal expansion system and technique is disclosed. The system comprises a detector for sensing an input signal and for producing responsively thereto a D.C. control signal having an amplitude as a function of the input signal, and a gain control amplifier for amplifying the input signal, the amplifier including means for controlling the gain of the amplifier as a function of the amplitude of the control signal. The improvement comprises means for varying the amplitude of the D.C. signal at least in part as a function of the time derivative of that amplitude.

12 Claims, 3 Drawing Figures

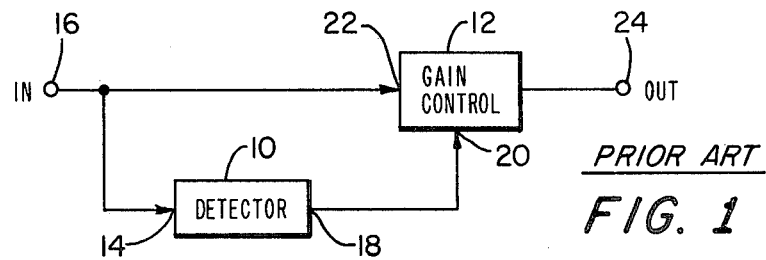
_PRIOR ART_
FIG. 1

SIGNAL EXPANDER

The present invention relates to electrical signal-conditioning systems and methods and more particularly to improved systems for and methods of expanding the dynamic range of electrical signals.

Signal conditioning systems are widely known for processing electrical signals transmitted through or recorded on a medium which limits the dynamic range of signals transmitted or recorded. These systems are most often used with audio signals so as to preserve the content of the original audio signal transmitted or recorded. For example, radio transmission media and recording media often have a far more limited dynamic range, e.g. about 60 dB, than the dynamic range of the original audio signal to be transmitted or recorded. Thus, where the original program has a dynamic range of 120 dB, the audio signal transmission through or recording on these media will result in loss of signal dynamics. Consequently, the relative differences psychoacoustically perceived by the listener between the loud and soft passages will be reduced on reception or playback. By using a signal-conditioning system called a "compressor," the dynamic range of the audio signal can be compressed, i.e., proportionally reduced, prior to transmission or recording, and expanded, i.e. proportionally increased, on reception or playback via an expander, thereby substantially preserving the dynamics of the original signal. By way of example, by compressing the original program signal having a dynamic range of 120 dB at a compression ratio of 2:1 the signal can be transmitted through or recorded on a medium which has a limited 60 dB range, whereupon the signal can be subsequently expanded on reception or play back to its original 120 dB range. Often, even though the original program may not be compressed prior to subsequent transmission or recording, subsequent expansion of the transmitted or recorded audio signal can produce a signal having a dynamic range similar to the originally transmitted or recorded signal.

One type of expander which has proven commercially successful is a single-band (i.e., the entire frequency band of the signal is transmitted through the same channel) expander of the type comprising a signal detector which senses the input signal and in response thereto produces a D.C. control signal, the amplitude of which is a function of the amplitude of the program input signal. The amplitude of control signal may, for example, be a function of the peak amplitude, average amplitude or RMS amplitude of the input signal. This type of signal-band expander also comprises a gain control amplifier for amplifying the input signal, the gain of the amplifier varying as a function of the amplitude of the control signal. This latter function is typically determined at least in part by the amount of expansion, i.e., the expansion ratio desired. An example of a system which can function as a signal-band expander of the type described is disclosed and claimed in U.S. Pat. No. 3,789,143 issued to David E. Blackmer on Jan. 29, 1974.

Although such systems are quite effective in expanding the signal upon reception or playback, such systems are often undersensitive to the portions of the input signals, such as signal transients, in which the amplitude varies quickly with respect to time. More specifically, many of these expanders are unable to follow rapid envelope changes of the electrical input signal without producing the psychoacoustical effect of long-release-time pumping and breathing. This phenomenon generally occurs when the amplitude of the signal suddenly changes, such as that occurring in a signal representative of a musical crescendo which produces a sudden surge in volume. Many of these expanders are also designed to obtain smoothness-of-expansion as the amplitude of the input signal slowly changes in a dynamic sense. As a result, the release time is often too slow to follow the musical envelope such as those, for example, produced by fast tempo music, and as a result the expander appears, to the listener, to have little or no effect. Attempts to decrease the release time of these types of single-band expanders increases the ripple in the control signal to the gain control amplifier resulting in an increase in low frequency distortion.

It is therefore a principal object of the present invention to provide an improved signal expansion method and system which overcomes or substantially reduces the above-noted problems encountered by the prior art.

More specifically, objects of the present invention are to provide an improved signal expansion method of and system for providing an increase in the apparent impact of the expander on transient signals, which allows a relatively long release time for dynamically slowly changing signals; which provides relatively smooth action as the amplitude of the input signal slowly changes with time; which recovers quickly from transient signals and which provides relatively low ripple in the control signal and relatively little low-frequency distortion in the expanded output signal.

These and other objects are achieved by an improved signal-conditioning system for expanding the dynamic range of an electrical input signal. The system is of the type comprising means for sensing the input signal and for producing, in response thereto, a D.C. control signal having an amplitude as a function of the amplitude of the input signal, amplifier means for amplifying the input signal and means for controlling the gain of the amplifier means as a function of the amplitude of the control signal. The improvement comprises means for varying the amplitude of the control signal at least in part as a function of the time derivative of that control signal amplitude.

Other objects of the invention will in part be obvious and will in part appear hereinafter. The invention accordingly comprises the apparatus possessing the construction, combination of elements, and arrangement of parts and the several steps and the relation of one or more of such steps with respect to each of the others which are exemplified in the following detailed disclosure, and the scope of the application of which will be indicated in the claims.

For a fuller understanding of the nature and objects of the present invention, reference should be had to the following detailed description taken in connection with the accompanying drawing wherein:

FIG. 1 is a block diagram of a prior art signal expansion system;

Figure 2:
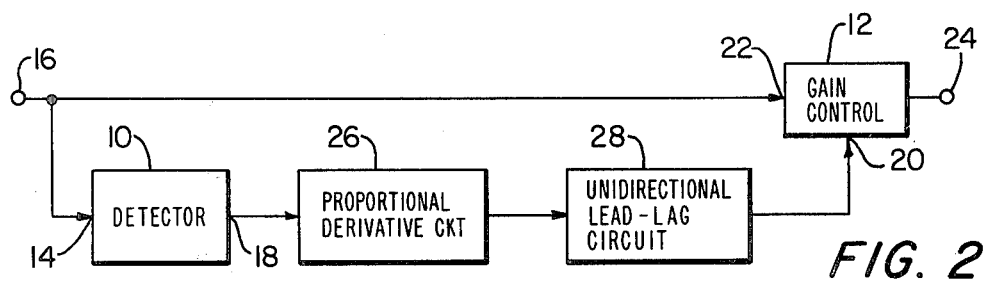
FIG. 2 is a block diagram of the preferred embodiment of the present invention.

Referring to FIG. 1 the system shown is a prior art single-band signal expansion system of the type to which the present invention relates. Generally, the system includes a signal level detector 10 and a gain control amplifier 12. Detector 10 has its input terminal 14 connected to the input terminal 16 of the system and its output terminal 18 connected to the control terminal 20 of amplifier 12. Detector 10 is designed to detect at input terminal 14 the input signal applied to system input terminal 16 and to produce responsively thereto, a D.C. voltage control signal having an amplitude in accordance with a function of the amplitude (such as the average, peak or RMS amplitude) of the input signal at input terminal 16. The gain control amplifier is designed to amplify the input signal applied to input terminal 22 of the amplifier. The gain of the amplifier varies as a function of the D.C. amplitude of the voltage control signal so as to provide an expanded signal at the output terminal 24. The preferred system which the present invention is an improvement, is of the type employing an RMS detector of the type shown and described in U.S. Pat. No. 3,681,618 issued to David E. Blackmer on Aug. 1, 1972. Such an RMS detector provides a negative D.C. voltage signal at its output terminal as a function of the RMS of the signal appearing at its input terminal. The amplifier 12 is preferably a voltage control amplifier similar to the one shown and described in U.S. Pat. No. 3,714,462 issued to David E. Blackmer on Jan. 30, 1973, with internal additional buffer and attenuating interface circuitry, such circuitry being well known in the art.

In order to increase the apparent impact of this type of expander on transient signals without long-release-time accompanying pumping and breathing, and still allow a fairly long release time for low distortion and smooth action, the expansion system shown in FIG. 1 is modified in accordance with FIG. 2. In FIG. 2, the output terminal 18 of detector 10 is connected to means, preferably in the form of proportional-derivative circuit 26, for proportionally varying the amplitude of the signal output of detector 10 as a function of the time derivative of such amplitude. Circuit 26 is preferably designed so that a sudden change in the dynamics of the input signal at input terminal 16 which produces a change in the D.C. output signal of detector 18, brings about a change in the transmittance of circuit 26. The mount of change in transmittance of circuit 26 is preferably a function of the first time derivative of the D.C. output signal of the detector. The output of circuit 26 is thus in part dependent upon the first time derivative of the signal output of detector 10. The output of circuit 26 is preferably coupled to the control terminal of gain control amplifier 12, through means in the form of unidirectional lead-lag circuit 28, for processing the control signal output of circuit 26 so as to provide relatively long release time for low distortion and smooth action in the expansion of signals transmitted through gain control amplifier 12.

Figure 3:
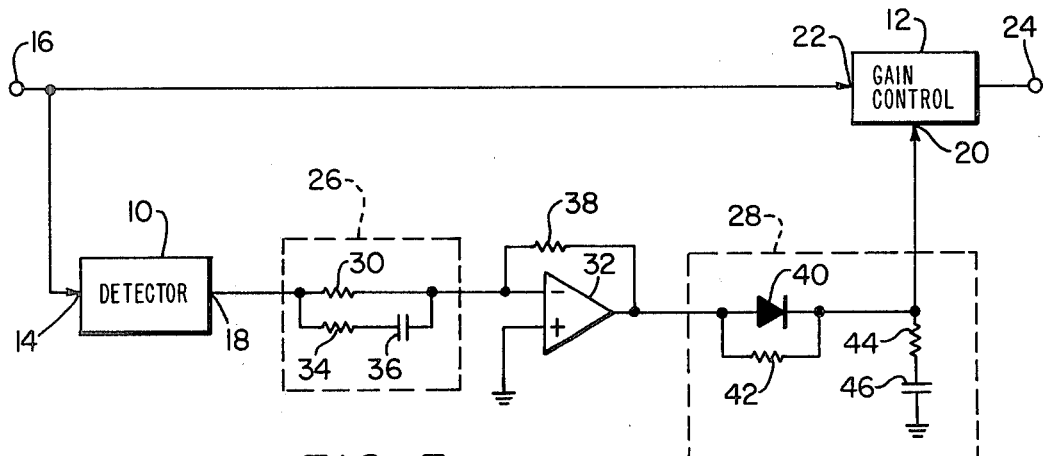
FIG. 3 is a partial schematic, partial block diagram of the preferred embodiment of the present invention.

The preferred circuits 26 and 28 are illustrated in FIG. 3. The proportional-derivative circuit 26 comprises a first transmissive path comprising resistor 30 connected between the output terminal 18 of detector 10 and the negative input terminal of operational amplifier 32 (the purposes of which will be described hereinafter) and a second transmissive path, parallel to the first transmissive path, connected between the output terminal 18 and the negative input of amplifier 32 and comprising resistor 34 and capacitor 36, resistor 34 and capacitor 36 being connected in series with one another. The positive input of operational amplifier 32 is connected to system ground while the negative input is connected through feedback resistor 38 to the output of amplifier 32.

The output of amplifier 32 is connected to the anode of unidirectional conductive means in the form of diode 40 of the circuit 28. The cathode of diode 40 is connected to its anode through feedback resistor 42 of circuit 28, to control terminal 20 and to resistor 44 of circuit 28. Resistor 44 is in turn connected to capacitor 46 of circuit 28, which in turn is connected to ground. Capacitor 46 functions as a memory capacitor since it continuously charges or discharges responsively to the instantaneous value of the control signal applied to control terminal 20 of gain control amplifier 12. For reasons which will be more apparent hereinafter the values of resistor 44 and capacitor 46 are chosen to be relatively large. (For example, resistor 44 can be 27 Kohms and capacitor 46 can be about 0.56$\mu$farads).

In operation, the program input signal is applied to terminal 16. The preferred detector 10 provides a negative D.C. voltage signal having an amplitude as a function of the RMS amplitude of the input signal, i.e. as a function of the "loudness" of the signal. For constant or relatively slow dynamically varying signals applied to input 16, the D.C. voltage level output at terminal 18 is relatively constant or slowly varying. In such a situation, the first time derivative of the control signal is small and the transmittance offered by circuit 26 is essentially only that offered by the first transmissive path comprising resistor 30. Under these conditions capacitor 36 essentially blocks any current through resistor 34. Where, however, a sudden change in dynamics of the input signal produces a change in the D.C. signal level output of detector 10, the capacitor 36 begins to conduct. The degree to which capacitor 36 becomes conductive is a function of the time rate of change, i.e. the time derivative, of the output signal appearing at output terminal 18 of detector 10. When capacitor 36 beings to conduct, both transmissive paths of circuit 26, are conductive, thereby modifying, i.e. increasing the transmittance of circuit 26, accordingly. Specifically, the transmittance of circuit 26 is proportional to the first time derivative of the amplitude of the output signal of detector 10 so that as the first time derivative increases the transmittance of circuit 26 increases. A step increase in amplitude of the input signal terminal 16 will therefore be over-expanded for a period of time of one time constant, (defined as the product of the sum of the values of resistor 30 and 34 times the value of capacitor 36), chosen nominally, for example, from 30 to 60 milliseconds.

The output of circuit 26 is applied to the negative input of operational amplifier 32. Amplifier 32 functions as an interface between circuits 26 and 28 so as to provide the proper voltage levels of the control signal output via circuit 28. Diode 40 and resistor 42 assumes that the type of extra expansion to be provided is that provided by positive changing signals at input terminal 16. In such a situation the output of detector 10 and circuit 26 will be negative. The negative polarity of the output of circuit 26 is effectively inverted by amplifier 32. Diode 40 is therefore forward biased so as to provide an instantaneous change in the control signal output of circuit 28 applied to control terminal 20. Since the values of resistor 44 and capacitor 46 are chosen to be relatively large, resistor 44 prevents capacitor 46 from charging excessively during this nominal period. When the transient goes away and the voltage output of detector 10 drops, diode 40 becomes reversed biased and capacitor 46 is allowed to discharge through resistor 42 (chosen to have a relative large value, for example 1 megohm) to the present value of the current program level provided by the output of amplifier 32. In this regard a program-level-dependent release time is established by resistor 42 (and to a minor extent by resistor 44). The program dependent release circuit thus formed by capacitor 46 and resistors 42 and 44 allow a fast discharge when there is a fast drop in voltage at the program-level output of amplifier 32, which occurs in response to a drop in input signal at input terminal 16. This release circuit reduces "hunting" to the final level subsequent to a transient condition.

The above improved system and technique for expanding electrical signals allows for greater expansion to occur for quickly changing transient "loudness" changes in the electrical signals than for smooth, slowly-varying loudness changes. This increase in the apparent impact of the expander on transients is accomplished with the use of circuits 26 and 28. Specifically circuits 26 and 28 allow relatively long release times without pumping and breathing, provide relatively smooth action as the amplitude of the input signal slowly changes with time; and provide relatively low ripple in the control signal applied to the control signal terminal 20 of amplifier 12 so as to provide relatively little low frequency distortion in the expanded output signal at output terminal 24. Finally, resistor 44 prevents capacitor 46 from charging excessively in response to transient input signals.

Although the above invention has been described in its preferred embodiment it will be obvious that various modifications can be made without departing from the invention. For example, although the embodiment is described as a single band expander, the principles can be utilized in one or more bands of a multiband expander.

Since certain changes may be made in the above apparatus and process without departing from the scope of the invention herein involved, it is intended that all matter contained in the above description or shown in the accompanying drawing shall be interpreted in an illustrative and not in a limiting sense.

What is claimed is:

1. In a signal conditioning system for expanding the dynamic range of an electrical input signal and comprising detection means for sensing said input signal and for producing responsively thereto a D.C. control signal having an amplitude in accordance with a function of the amplitude of said input signal, amplification means for amplifying said input signal, said amplifier means including means for controlling the gain of said amplification means as a function of said amplitude of said control signal, the improvement comprising:

means for varying said amplitude of said control signal at least in part as a function of the time derivative of said amplitude so as to modify said control signal, said means for varying said amplitude of said control signal including circuit means having an input terminal for receiving the output of said detection means and an output terminal, said circuit means including a first transmissive path between said input and output terminals and a second transmissive path, parallel to said first transmissive path, between said input and output terminals, at least one of said transmissive paths being variably transmissive as a function of said time derivative.

2. A system according to claim 1, wherein the transmittance of said one transmissive path increases with increases in said time derivative.

3. A system according to claim 1, wherein said one transmissive path includes capacitive means for increasing the transmittance of said one transmissive path as a function of said time derivative.

4. A system according to claim 3, wherein the other transmissive path is substantially purely resistive so that the effective transmittance between said input and output terminals of said circuit means increases with increasing values of said time derivatives of said amplitude.

5. A system according to claim 1, further including memory means for temporarily holding said modified control signal and releasing said modified control signal to the then current amplitude level of said modified control signal in accordance with a predetermined release time function as the amplitude of said then current amplitude level of said modified control signal varies wherein said release time function is such that the release time decreases in response to and following sudden decreases in said amplitude of said modified control signal.

6. A system according to claim 5, wherein said memory means includes capacitive means for temporarily holding said modified control signal, unidirectional conduction means conductive when said current amplitude level of said modified control is increasing relative to the modified control signal temporarily held by said capacitive means, and a resistive path connected in parallel to said unidirectional conduction means for discharging said capacitive means to said current amplitude level when said current amplitude level is decreasing with respect to the modified control signal level held by said capacitive means.

7. A system according to claim 6, wherein the charging time of said capacitive means is such that said capacitive means does not excessively charge within a predetermined time period.

8. A system according to claim 7, wherein said time period is from about 30 to 60 milliseconds.

9. A system according to claim 5, further including operational amplification means coupling said means for varying said amplitude and said memory means.

10. A system according to claim 1, wherein said system is a single-band expander.

11. A system according to claim 1, wherein said detection means produces an output signal as a function of the RMS amplitude of said input signal.

12. A system according to claim 1 wherein said time derivative is the first time derivative.

* * * * *